United States Patent
Bernardi et al.

(10) Patent No.: US 9,205,750 B2
(45) Date of Patent: Dec. 8, 2015

(54) METHOD TO ESTIMATE BATTERY OPEN-CIRCUIT VOLTAGE BASED ON TRANSIENT RESISTIVE EFFECTS

(71) Applicant: Ford Global Technology, LLC, Dearborn, MI (US)

(72) Inventors: Dawn Bernardi, Sterling Heights, MI (US); Thomas J. Coupar, Ann Arbor, MI (US); William T. Moore, Ypsilanti, MI (US); Josephine S. Lee, Novi, MI (US); Robert Taenaka, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 217 days.

(21) Appl. No.: 13/948,214

(22) Filed: Jul. 23, 2013

(65) Prior Publication Data

US 2015/0028808 A1  Jan. 29, 2015

(51) Int. Cl.
| | |
|---|---|
| B60L 11/00 | (2006.01) |
| B60L 11/18 | (2006.01) |
| H02J 7/00 | (2006.01) |
| G01R 31/00 | (2006.01) |

(52) U.S. Cl.
CPC ......... B60L 11/1809 (2013.01); B60L 11/1862 (2013.01); B60L 11/1866 (2013.01); B60L 11/1868 (2013.01); G01R 31/00 (2013.01); H02J 7/007 (2013.01); *B60L 2240/545* (2013.01); *B60L 2240/547* (2013.01); *B60L 2240/549* (2013.01); *B60L 2250/16* (2013.01)

(58) Field of Classification Search
None
See application file for complete search history.

(56) References Cited

U.S. PATENT DOCUMENTS

| | | | |
|---|---|---|---|
| 6,646,419 B1 | 11/2003 | Ying | |
| 6,850,038 B2 | 2/2005 | Arai et al. | |
| 7,679,329 B2 * | 3/2010 | Lim et al. | 320/132 |
| 7,728,555 B2 * | 6/2010 | Seo et al. | 320/132 |

(Continued)

FOREIGN PATENT DOCUMENTS

JP   2004354148 A   12/2004

OTHER PUBLICATIONS

Seongjun Lee et al. Science Direct, Journal of Power Sources: State-of-charge and capacity estimation of lithium-ion battery using a new open-circuit voltage versus state-of-charge, vol. 185, Issue 2, Dec. 1, 2008, Abstract Only.

(Continued)

*Primary Examiner* — Leigh Garbowski
(74) *Attorney, Agent, or Firm* — David B. Kelley; Brooks Kushman P.C.

(57) ABSTRACT

A vehicle is disclosed that includes a battery and a controller programmed to calculate a battery voltage characteristic from previously measured charge and discharge data. The battery voltage characteristic is based on differences between the previously measured values when state of charge falls in a range in which the differences are approximately equal. Outside of the range, the charge and discharge voltage data are corrected based on a square root of time to obtain the battery voltage characteristic. The characterization may be performed with a high-rate continuous charge and discharge cycle. Also disclosed is an apparatus for generating the battery characteristic that includes a bi-directional power supply. The battery voltage characteristic is obtained based on the differences of the charge and discharge voltage data and corrected data based on the square root of time. A method is also disclosed based on the same.

16 Claims, 4 Drawing Sheets

(56) References Cited

U.S. PATENT DOCUMENTS

| | | |
|---|---|---|
| 7,795,874 B1 | 9/2010 | Kirchev |
| 7,982,433 B2 * | 7/2011 | Lim et al. ............... 320/132 |
| 8,175,826 B2 | 5/2012 | Kang et al. |
| 2005/0073315 A1 | 4/2005 | Murakami et al. |
| 2006/0091862 A1 | 5/2006 | Melichar |
| 2009/0030626 A1 | 1/2009 | Iwane et al. |
| 2010/0045239 A1 | 2/2010 | Oki |
| 2010/0085009 A1 | 4/2010 | Kang et al. |
| 2010/0138178 A1 | 6/2010 | Paryani et al. |
| 2011/0148424 A1 * | 6/2011 | Chiang et al. ............ 324/427 |
| 2011/0285356 A1 * | 11/2011 | Maluf et al. ............. 320/139 |
| 2012/0112754 A1 * | 5/2012 | Kawai ...................... 324/428 |
| 2012/0133331 A1 * | 5/2012 | Ling et al. ............... 320/132 |
| 2013/0257323 A1 * | 10/2013 | Diamond et al. ........ 318/376 |
| 2014/0084846 A1 * | 3/2014 | Berkowitz et al. ...... 320/107 |
| 2014/0100802 A1 * | 4/2014 | Lee et al. ................. 702/63 |
| 2014/0172333 A1 * | 6/2014 | Gopalakrishnan et al. ..... 702/63 |
| 2014/0312912 A1 * | 10/2014 | Berkowitz et al. ...... 324/426 |

OTHER PUBLICATIONS

Matthias Durr, et al., Science Direct, Journal of Power Sources: Dynamic model of a lead acid battery for use in a domestic fuel cell system, vol. 161, Issue 2, Oct. 27, 2006, Abstract Only.

Cassacca, MA, et al., IEEE Xplore Digital Library, Determination of lead-acid battery capacity via mathematical modeling techniques, vol. 7, Issue 3, Sep. 1992, Abstract Only.

Salmeh, Z.M., et al., IEEE Xplore, A Mathematical model for lead-acid batteries, vol. 7, Issue 1, Mar. 1992, Abstract Only.

Electropaedia, Battery and Energy Technologies, Battery State of Charge Determination, http://www.mpoweruk.com/soc.htm, Apr. 5, 2011, 7 pages.

* cited by examiner

METHOD TO ESTIMATE BATTERY OPEN-CIRCUIT VOLTAGE BASED ON TRANSIENT RESISTIVE EFFECTS

TECHNICAL FIELD

This disclosure relates to battery cell open-circuit voltage estimation during charging and discharging.

BACKGROUND

For battery-powered devices the relationship of an equalized open-circuit voltage (OCV) to state-of-charge (SOC) may be required for an effective design. This relationship may be determined by the pulse method in which a series of current pulses of appropriate duration and magnitude is applied at a known SOC and OCV. This pulse moves the battery to a new SOC value where a new OCV value may be measured. The measurements are usually taken after allowing the battery to settle at the new operating point. Data recorded during the actual pulse application is not used in determining the relationship. In order to minimize the testing duration, a relatively high magnitude pulse current may be chosen. Currently the pulse method is an industrial standard and considered to be the most accurate way to determine the OCV vs. SOC relationship. However, the pulse method can be time consuming, taking on the order of weeks to complete. The pulse method only provides a limited number of data points based on the pulse characteristics. Within the entire SOC range, which is defined by operating voltage limits, 10 or 20 pulses are typically used to provide enough data to characterize the relationship.

SUMMARY

A vehicle is disclosed comprising at least one battery cell and at least one controller. The controller is programmed to charge and discharge the battery cell based on differences between previously measured charge and discharge voltage values of the battery cell. The difference is utilized in response to the state of charge of the battery cell falling within a range of states of charge for which the differences at each state of charge within the range are approximately equal. The controller may be further programmed to charge and discharge the at least one battery cell based on at least one of a charge time of the previously measured charge voltage values and a discharge time of the previously measured discharge voltage values in response to the state of charge falling outside of the range of states of charge. The controller may be further programmed to charge and discharge the at least one battery cell based on a root of charge time of the previously measured charge voltage values in response to the state of charge falling outside of the range of states of charge. The controller may be further programmed to charge and discharge the at least one battery cell based on a root of discharge time of the previously measured discharge voltage values in response to the state of charge falling outside of the range of states of charge. The previously measured charge and discharge voltage values may result from charging and discharging the at least one battery cell at a generally constant current such that the differences between the measured charge and discharge voltage values exceed a predetermined amount.

An apparatus is disclosed comprising a bi-directional power supply electrically connected to at least one battery cell and at least one controller. The controller is programmed to generate output representing a relationship between voltage and state of charge for the at least one battery cell based on differences between measured charge and discharge voltage values of the at least one battery cell while a state of charge of the at least one battery cell falls within a range of states of charge for which the differences at each state of charge within the range are approximately equal. The controller may be further programmed to generate output representing the relationship between voltage and state of charge for the at least one battery cell based on a charge time while charging and a discharge time while discharging when the state of charge falls outside of the range of states of charge. The bi-directional power supply may be commanded to charge and discharge the at least one battery cell with a generally constant current based on a rated current capacity of the at least one battery cell. The controller may be further programmed to generate output representing the relationship between voltage and state of charge for the at least one battery cell based on a root of charge time when charging at a state of charge outside of the range of states of charge. The controller may be further programmed to generate output representing the relationship between voltage and state of charge for the at least one battery cell based on a root of discharge time when discharging at a state of charge outside of the range of states of charge.

A method is disclosed comprising a step of measuring voltage values across a battery during charging and discharging. A relationship between voltage and state of charge is calculated based on differences between the measured voltage values while a state of charge of the battery falls within a range of states of charge for which the differences at each state of charge within the range are approximately equal. A relationship between voltage and state of charge is outputted. The relationship between voltage and state of charge for the battery may be further based on a root of charge time when charging at a state of charge outside of the range of states of charge. The relationship between voltage and state of charge for the battery may be further based on a root of discharge time when discharging at a state of charge outside of the range of states of charge. The differences between the voltage values measured during charging and the voltage values measured during discharging may be averaged over the range of states of charge. The charging and discharging may be at a generally constant current such that differences between the measured charge and discharge voltage values exceed a predetermined amount.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
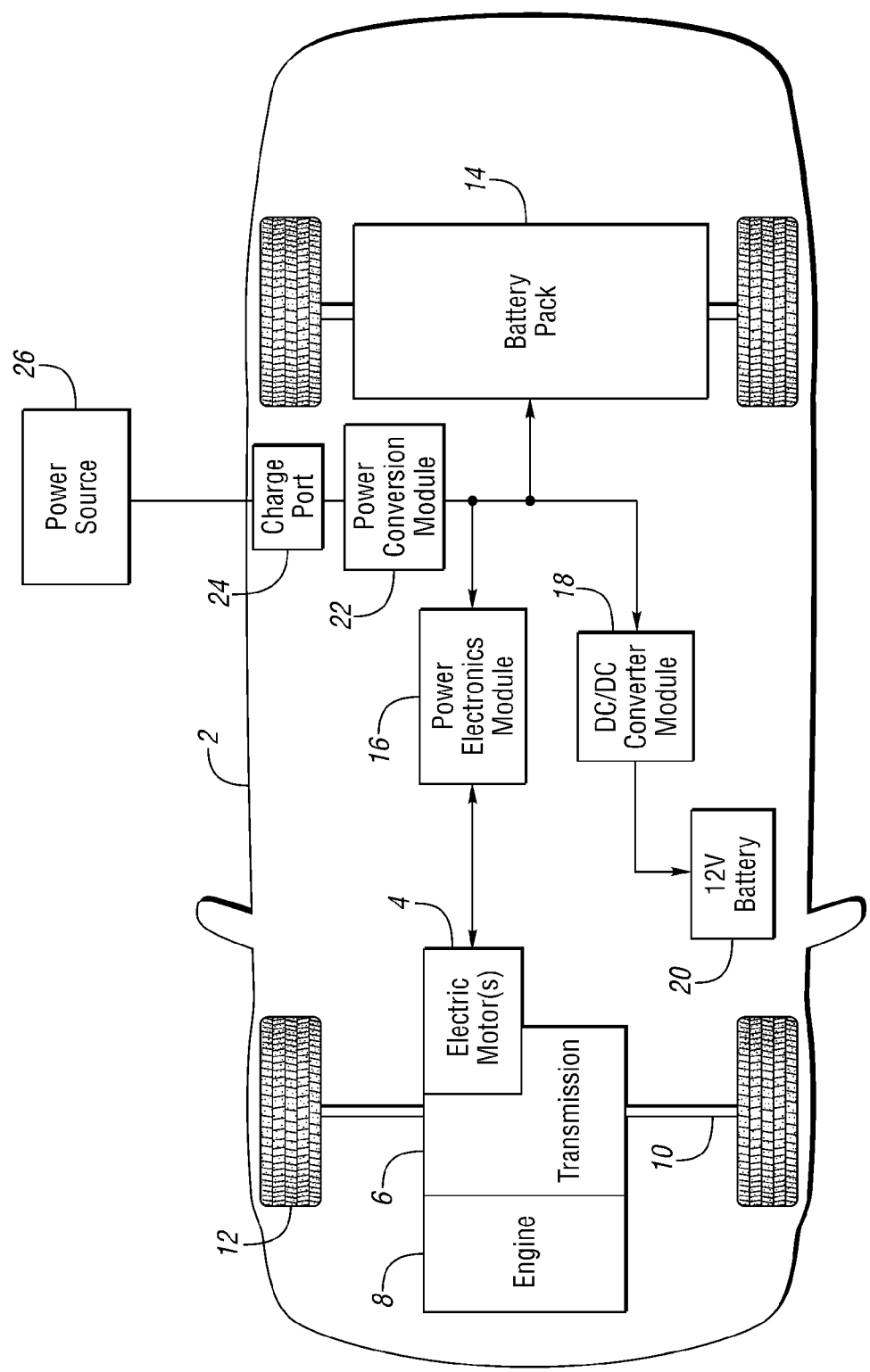
FIG. 1 is a diagram of a plug-in hybrid-electric vehicle illustrating typical drivetrain and energy storage components.

FIG. 1 depicts a typical plug-in hybrid-electric vehicle. A typical hybrid-electric vehicle 2 may comprise one or more electric motors 4 mechanically connected to a hybrid transmission 6. In addition, the hybrid transmission 6 is mechanically connected to an engine 8. The hybrid transmission 6 is also mechanically connected to a drive shaft 10 that is mechanically connected to the wheels 12. The electric motors 4 can provide propulsion and deceleration capability when the engine 8 is turned on or off. The electric motors 4 also act as generators and can provide fuel economy benefits by recovering energy that would normally be lost as heat in the friction braking system. The electric motors 4 may also provide reduced pollutant emissions since the hybrid electric vehicle 2 may be operated in electric mode under certain conditions.

The battery pack 14 stores energy that can be used by the electric motors 4. A vehicle battery pack 14 typically provides a high voltage DC output. The battery pack 14 is electrically connected to the power electronics module 16. The power electronics module 16 is also electrically connected to the electric motors 4 and provides the ability to bi-directionally transfer energy between the battery pack 14 and the electric motors 4. For example, a typical battery pack 14 may provide a DC voltage while the electric motors 4 may require a three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14. The description herein is equally applicable to a pure electric vehicle or any other device using a battery pack. For a pure electric vehicle, the hybrid transmission 6 may be a simple gear box connected to an electric motor 4 and the engine 8 may not be present.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads, such as compressors and electric heaters, may be connected directly without the use of a DC/DC converter module 18. In a typical vehicle, the low voltage systems are electrically connected to a 12V battery 20.

The vehicle may be a plug-in hybrid in which the battery pack may be recharged by an external power source 26. The external power source 26 may provide AC or DC power to the vehicle 2 by electrically connecting through a charge port 24. The charge port 24 may be any type of port configured to transfer power from the external power source 26 to the vehicle 2. The charge port 24 may be electrically connected to a power conversion module 22. The power conversion module may condition the power from the external power source 26 to provide the proper voltage and current levels to the battery pack 14. In some applications, the external power source 26 may be configured to provide the proper voltage and current levels to the battery pack 14 and the power conversion module 22 may not be necessary.

Figure 2:
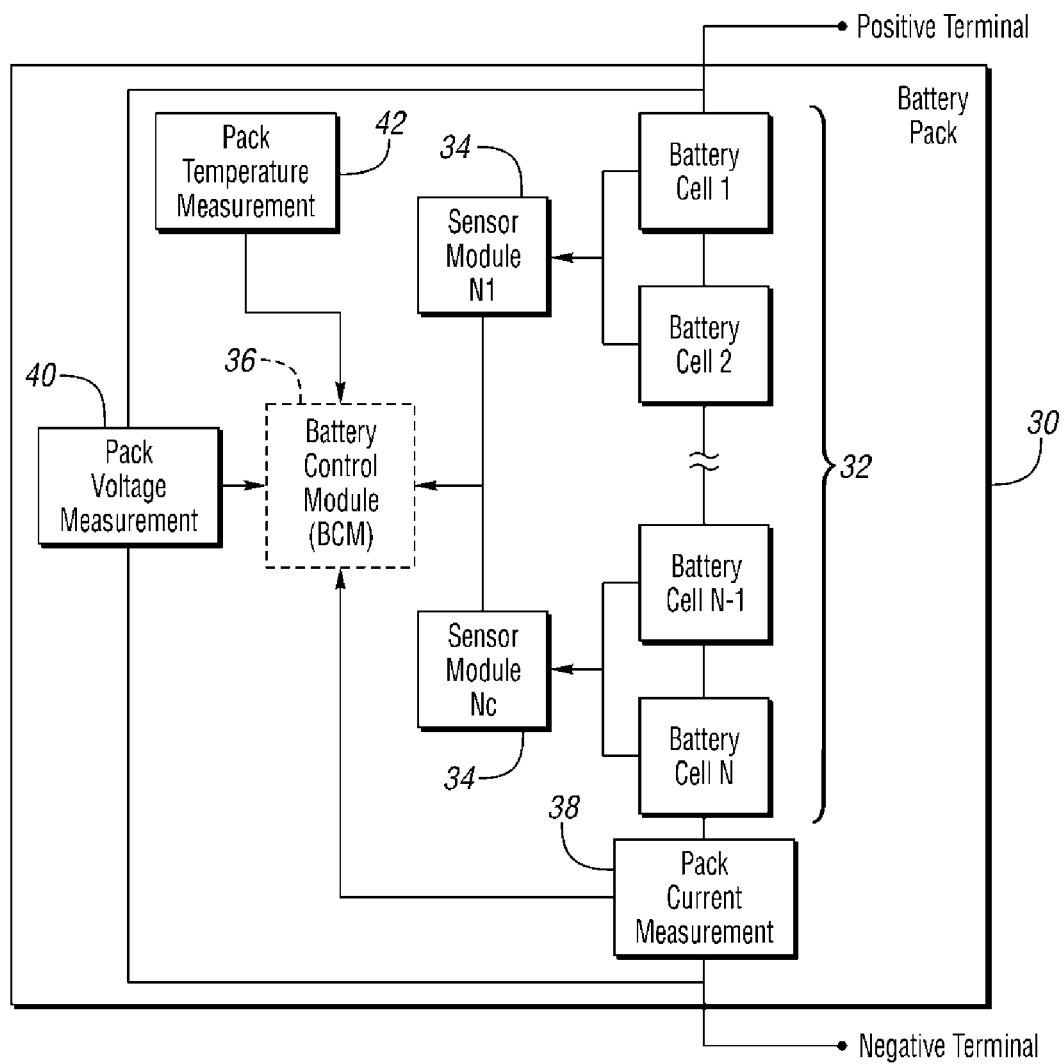
FIG. 2 is a diagram of a possible battery pack arrangement comprised of multiple cells, and monitored and controlled by a Battery Control Module.

Battery packs may be constructed from a variety of chemical formulations. Typical battery pack chemistries are lead acid, nickel-metal hydride (NIMH) or Lithium-Ion. FIG. 2 shows a typical battery pack 30 having a configuration of N battery cells 32 connected in series. A battery pack 30 may be composed of a number of individual battery cells 32 connected in series or parallel or some combination thereof. A typical system may have a Battery Control Module (BCM) 36 that monitors and controls the performance of the battery pack 30. The BCM 36 may monitor several battery pack level characteristics such as pack current 38, pack voltage 40 and pack temperature 42.

In addition to the pack level characteristics, there may be battery cell 32 characteristics that are measured and monitored. For example, the open-circuit voltage, current, and temperature of each cell 32 may be measured. A system may use a sensor module 34 to measure the battery cell 32 characteristics. Depending on the capabilities, a sensor module 34 may measure the characteristics of one or multiple battery cells 32. A battery pack 30 may utilize up to Nc sensor modules 34 to measure the characteristics of all the battery cells 32. Each sensor module 34 may transfer the measurements to the BCM 36 for further processing and coordination. The sensor module 34 may transfer signals in analog or digital form to the BCM 36. Alternatively, some configurations may implement the sensor module 34 functionality entirely within the BCM 36.

The relationship of battery open-circuit voltage (OCV) to state-of-charge (SOC) may be important for the effective design and operation of battery-powered devices. In automotive propulsion applications, the vehicle may require an estimation of this characteristic in order to limit the power demands on the battery and to perform SOC checks during vehicle operation. This relationship may be important for optimal charging and discharging of the battery pack. The relationship may be measured during vehicle development and stored in a vehicle controller. The OCV vs. SOC relationship may change over time and use of an inaccurate characteristic may lead to a loss of battery power capability and a reduction of all-electric driving range. The OCV vs. SOC relationship may be characterized and utilized in battery controllers to optimize vehicle performance and hybrid fuel economy.

The disclosed embodiments, based on transient resistive information, may characterize this relationship more effectively than present estimation methods. The disclosed embodiments may allow OCV information to be obtained from higher rate continuous charge/discharge cycles. A faster characterization method may allow a battery state-of-health (SOH) assessment during a standard service inspection and during vehicle operation. The control strategy may then be updated based on the characterization data as part of a customer's regular vehicle maintenance plan leading to increased fuel economy and driving range over the life of the vehicle.

The disclosed embodiments may also lead to more efficient battery test methods. Improved battery test methods may be useful for screening suppliers, designing battery packs and vehicles, and improving battery control strategies. The disclosed embodiments provide a continuous OCV vs. SOC relationship and offer insights that may not be visible in the discrete relationship obtained using the standard pulse method. The disclosed embodiments may be completed in less time than very low-rate discharges that are sometimes used. The disclosed embodiments also allow for the determination of important battery design information, such as electrode capacity ratios, electrode compositions, and estimated amounts of active materials, without cell disassembly.

From a theoretical standpoint, continuous discharge/charge behavior (i.e., a single pulse) may also be used to determine the OCV vs. SOC relationship. In the limit of infinitesimally low current, the charge and discharge voltages should be equal to each other and to the true, or thermodynamic, OCV. These low-rate methods require a long period of time to generate results. Therefore, low-rate methods are of limited use in a production or service environment. These low-rate methods generate the best results when the rate is low such that the charge and discharge curves form a narrow envelope about the actual OCV curve.

However, in practice, only finite discharge/charge currents may be available. Corrections may be determined for voltage discrepancies resulting from the use of finite rates, rather than infinitesimally small rates. In this case, data collected during the actual pulse duration may be used in determining the relationship. With appropriate processing, the finite-rate method can yield an estimate of OCV with acceptable accuracy. The reduced estimation time is an advantage over the pulse method.

The method may be implemented by using two pulses: a single discharge pulse and a single charge pulse. There may be a rest period between the discharge and charge pulses. This resembles a traditional "capacity check" that is performed as a state-of-health diagnostic, typically at a 1-hour rate during battery performance and life testing. It would be advantageous if the OCV vs. SOC relationship could be obtained from standard capacity-check data. Presently, this relationship is not monitored during battery life studies because the pulse method is so time intensive.

In addition to saving time, the disclosed methods may have other advantages. The methods may provide a more continuous OCV vs. SOC relationship, whereas the pulse method typically gives OCV values at discrete SOC intervals. A continuous relationship may show features that would otherwise not be apparent in the discrete results given by the pulse method. These features may provide valuable information relating to the OCV behavior of the individual electrodes, which may be used to determine electrode capacity ratios, degrees of lithiation, and compositions, as well as amounts of active material, without cell disassembly. Furthermore, changes in the OCV vs. SOC relationship throughout battery life can give additional information about the mechanisms that degrade battery power and coulombic capacity. Characterization of the change in the relationship throughout life may lead to improved battery control strategies in hybrid and all-electric vehicles.

Figure 3:
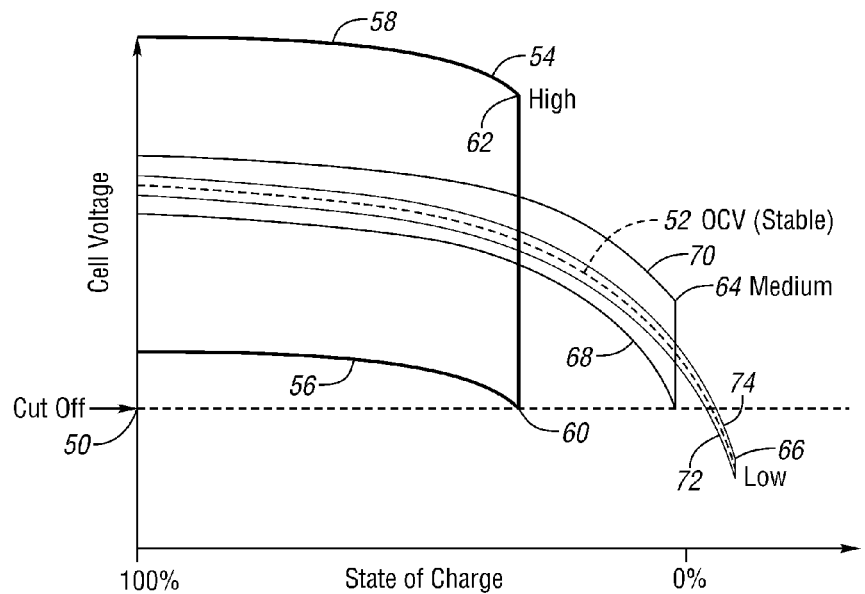
FIG. 3 is a graph of cell voltage as a function of state of charge for various sample charge/discharge current profiles.

At thermodynamic equilibrium with a given electrode composition (i.e., degree of lithiation) and temperature, the OCV of a lithium-ion battery is stable and constant. Some example battery charge and discharge cycles at different rates are depicted in FIG. 3. Battery SOC may be characterized by applying a 1-C discharge until the voltage falls below a specified cut-off voltage 50. A 1-C discharge draws a current equal to the rated capacity of the battery and theoretically charges or discharges the battery completely within one hour. The state of charge may be derived from the time by knowing the charge/discharge rate and the rated capacity of the battery. A C-rate greater than one charges or discharges the battery in less than one hour (e.g., 2–C=0.5 hours), while a C-rate less than one charges or discharges the battery in more than one hour (e.g., 0.1–C=10 hours). After the discharge current is interrupted, which usually occurs at the cut-off voltage 50, the cell open-circuit voltage undergoes relaxation processes and equilibrates to a stable OCV value 52 (represented by the dashed line in FIG. 3). At slow discharge rates, the cut-off voltage 50 may correspond to 0% SOC. The SOC may be calculated during the cycle based on a measurement of the current during the cycle.

The high current curve 54 may represent the pulse-method of OCV determination in which an OCV value is obtained at a certain SOC after a constant-current pulse. An OCV vs. SOC relationship may be derived from a collection of such OCV determinations at different SOC values. Any data collected during the pulse is usually not considered useful for determining the relationship. The high current pulse curve 54 consists of two distinct curves. The first curve 56 represents the discharge pulse while the second 58 represents the charge pulse. It is observed that the OCV is bounded below by the discharge curve 56 and above by the charge curve 58. When the cells transition from discharging to charging, it is observed that the OCV is bounded below by the voltage just before discharge current interrupt 60 and above by the voltage just after charge current onset 62. The OCV is bounded above and below providing a basis for the disclosed method of OCV determination. For an ideally resistive cell, the OCV would be midway between the discharge voltage curve 56 and the charge voltage curve 58.

A slower charge/discharge rate 64 is also depicted. This curve depicts a similar behavior as the high current pulse data 54 except that the charge 70 and discharge 68 curves are closer to the actual OCV curve 52. Again, the stable OCV curve 52 is bounded above and below by the charge 70 and discharge 68 curves. As the charge/discharge rate decreases, the charge and discharge curves may converge to the actual OCV curve 52.

In the limit of a C/∞ discharge, the voltage relaxation after discharge approaches zero, coulombic capacity approaches a maximum value, and the discharge voltage approaches the OCV. As the charge/discharge rate decreases, the difference between the charge and discharge curves decreases. At an infinitely small rate, the curves may have only a very small difference. A very low-rate discharge/charge cycle 66 is shown that closely circumscribes the complete OCV vs. SOC relationship 52. At low enough rates of charge/discharge, an estimate of the OCV would be the average of the discharge and charges voltages for a given SOC. The disadvantage of a low-rate discharge/charge cycle is that it requires more time to complete the characterization.

The disclosed method uses a higher rate continuous discharge/charge rate (e.g., 1C rate) and applies correction factors to estimate the actual OCV. This method is based on the premise that observations of transient behavior can be used to distinguish resistive processes. Similar techniques may be used in electrochemical impedance spectroscopy to separate ohmic, charge-transfer, and concentration junction resistances.

Transient voltages occurring at the onset and interruption of current in the discharge/charge capacity tests may be used to correct the voltage measurements. At current onset, thermal and concentration junction effects are initially absent, while double-layer, ohmic, and charge-transfer overvoltage are apparent, which may be termed the initial resistive overvoltage, $\eta_i$. At current interrupt, double-layer, ohmic, and charge-transfer overvoltages dissipate rapidly (<100 ms), leaving concentration junction overvoltage, $\eta_t$, a transient resistive effect, to dissipate and return the cell to a stable OCV. The total overvoltage may be designated as $\eta$ and the discharge (or charge) time as t.

Four observations may be made from the discharge and charge portions of the continuous discharge/charge voltage behavior: (1) the voltage deviation due to initial resistive factors, $\eta_i$, (2) the maximum voltage deviation due to initial and transient resistive factors ($\eta_i+\eta_t^{ss}$), (3) the approximate transition time $t_{ss}$ to reach the steady-state maximum voltage deviation, and (4) the time $t_j$ at which discharge and charge OCV estimates should be joined. The time $t_j$ may also be considered as the approximate time to reach the steady-state maximum voltage deviation during charging. In the steady-state region, the OCV may be estimated as the average of the charge voltage and the discharge voltage. Outside the steady-state region, discharge data may be corrected and charge data may be corrected to yield the OCV estimate. The steady-state values may be combined with the corrected data resulting in a complete OCV vs. SOC estimate over the entire range. The location of the steady-state region may be found by examining the behavior of the system. The steady-state region may be where the difference values between the charge voltage and discharge voltage are approximately equal over the range.

Experimental data indicates that the initial resistance observed just after current onset may be nearly constant, independent of the current level. This means that the overvoltage varies by the product of the current and resistance. Since the current varies with the C-rate while resistance is constant, $\eta_i$ at a 10–C rate is about half that at a 20–C rate, $\eta_i$ at a 5–C rate is approximately half that at a 10–C rate, and $\eta_i$ at a 3–C rate is about a third that at a 10–C rate. The concentration junction overvoltage may be defined as $$\eta_t = OCV - (V_{dch} + \eta_{i,dch}) \tag{1}$$

where $V_{dch}$ is the measured discharge voltage and $\eta_{i,dch}$ is the overvoltage at the onset of the discharge cycle. An analytic solution for surface concentration for the problem of unsteady diffusion in a sphere with constant surface flux may be considered. The resulting short-time solution indicates that the surface concentration may vary linearly with $\sqrt{t}$ for a given flux value. Other battery chemistries may vary with other functions of time. It has also been observed that the slopes of the linear regions for each value of current are the same, which might be expected for a given value of lithium diffusivity and particle radius. The initial diffusivity is presumed to be the same for the various current values. Although the concentration junction overvoltage is related to the ratio of surface lithium activity to equilibrated lithium activity, this overvoltage may be expected to initially follow a relationship to $\sqrt{t}$. Thus we observe empirically that initially $\eta_t$ is proportional to the product of current, designated as I, and $\sqrt{t}$. However, there is a plausible explanation for the observation based on the transport processes occurring within the cell. The observation also leads to an explanation of the behavior in which the voltage relaxation (which is predominantly the concentration junction overvoltage) is proportional to $\sqrt{I}$. Because the data are all associated with a nearly constant SOC change (i.e., 10%) we may write $$I \alpha \frac{1}{t} \tag{2}$$

from which it follows that:

$$\sqrt{t} \alpha \frac{1}{\sqrt{I}} \tag{3}$$

This empirical observation above may be written symbolically as $$\eta_t \alpha N\sqrt{t} \tag{4}$$

The substitution of equation (3) into equation (4) yields $$\eta_t \alpha \sqrt{I} \tag{5}$$

Although most apparent at lower rates, the concentration junction overvoltage appears to approach a constant value, dependent on rate after a certain period of time. This may also be expected when the problem of unsteady diffusion in a sphere is considered. The long-time solution to the problem indicates that the surface concentration will vary linearly with t for a given flux value. At long times, since both the equilibrated concentration and the surface concentration vary linearly in time, a constant concentration junction overvoltage might be expected. The arguments regarding the short-time and long-time solutions to the spherical problem, respectively, form the basis for the determination of $\eta$ and $\eta_t^{ss}$, which are used for the OCV estimation.

The disclosed method may be used with voltage data collected at a relatively fast charge/discharge rate. For example, a 1C rate may be applied to charge and discharge the battery. However, the method is not limited to any particular rate and may be utilized with a variety of different charge/discharge rates. The discharge voltage data may be measured and corrections may be applied to the data to obtain part of the total OCV characteristic. A voltage correction for the discharge voltage data may be utilized in a predetermined range or ranges of state of charge. Charge voltage data may also be measured and the corrections applied to the charge voltage data to complete the OCV characteristic. By combining the corrected voltage ranges, one complete curve or characteristic may be obtained over the entire SOC range. The voltage ranges may be joined at a point $t_j$ such that the corrected OCV values are equal to the non-corrected OCV values at this point. An advantage of the proposed method is that the OCV characteristic may be obtained in a relatively short time.

Figure 4:
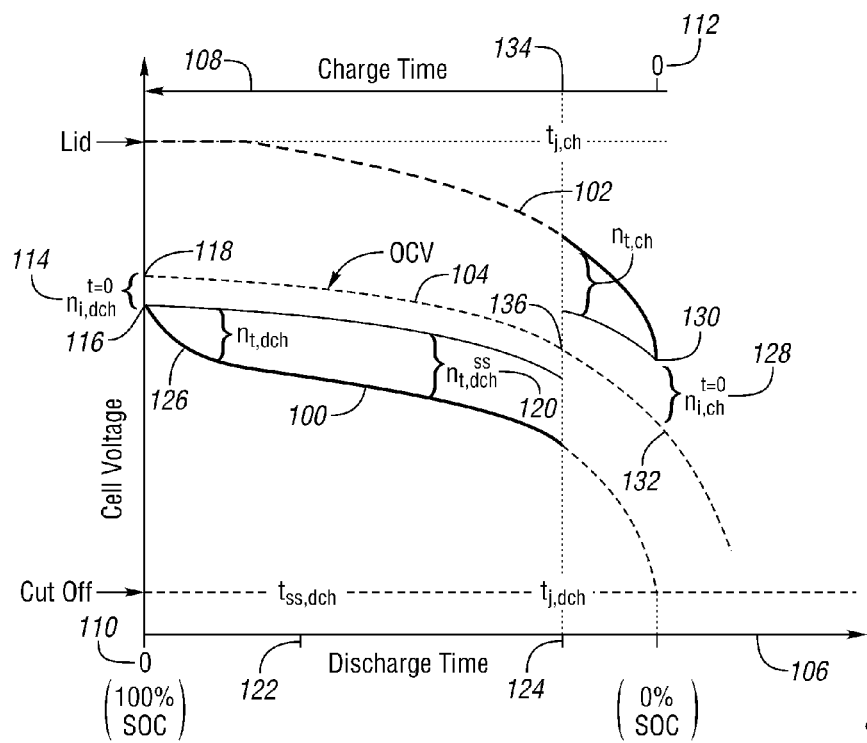
FIG. 4 is a graph depicting the various quantities used in the disclosed method for determining the open-circuit voltage versus state of charge relationship for a battery cell.

After voltage measurement data is obtained, the measured discharge and charge voltage data may be corrected for the transient resistive effects. The concept is depicted graphically in FIG. 4. The discharge curve 100 is plotted with respect to the discharge time 106 on the bottom axis. The discharge time 106 runs from zero 110 at the left side and increases as the curve moves to the right. The discharge time of zero 110 corresponds to a point at which the battery is fully charged to 100 percent SOC. Knowing the discharge rate and the rated capacity of the battery allows the time to be equated to an equivalent SOC value. Alternatively, current may be measured and the SOC may be calculated based on the current and the time associated with charging and discharging.

The charge time of zero 112 corresponds to a point at which the battery is fully discharged to zero percent SOC. The charge curve 102 is plotted with respect to the charge time 108. The charge time 108 runs from zero 112 at the right side and increases as the curve moves to the left. In the following formulas, $V_{dch}$ 100 represents the measured voltage during the discharge cycle and $V_{ch}$ 102 represents the measured voltage during the charge cycle.

During the discharge cycle, the OCV 104 may be determined as follows:

$$OCV = V_{dch} + \eta_{i,dch} + \eta_{t,dch} \tag{6}$$

where $$\eta_{i,dch} = \eta_{dch}^{t=0} \text{ for } 0 < t \leq t_{j,dch} \tag{7}$$

$$\eta_{t,dch} = \frac{\eta_{t,dch}^{ss}}{\sqrt{t_{ss,dch}}} \sqrt{t} \text{ for } 0 < t < t_{ss,dch} \quad (8)$$

$$\eta_{t,dch} = \eta_{t,dch}^{ss} \text{ for } t_{ss,dch} \le t \le t_{j,dch} \quad (9)$$

In equations (6) through (9), t is the discharge time and the overvoltages, η, are defined as positive quantities.

The value of $\eta_{i,dch}$ 114 may be obtained by subtracting the voltage at the first data point collected 116 after current onset from a stable OCV 118 prior to discharge current onset. This value may be measured at or near the start of the current discharge cycle.

The steady state overvoltage value, $\eta_{t,dch}^{ss}$ 120 may be determined from examining the steady state voltage deviations. This may be determined from the measured data by finding the point at which the voltage decay is nearly constant. The range where $\eta_{t,dch}^{ss}$ is constant may be between a time $t_{ss,dch}$ 122 and a time $t_{j,dch}$ 124. During this period, an average of the difference between the charge voltage, $V_{ch}$ 102, and the discharge voltage, $V_{dch}$ 100, may be calculated. Once an average value is calculated, the steady-state discharge overvoltage, $\eta_{t,dch}^{ss}$, may be determined from the following:

$$\text{Average}_{Vch-Vdch} = 2(\eta_{i,dch} + \eta_{t,dch}^{ss}) \quad (10)$$

Further solving equation (10) for $\eta_{t,dch}^{ss}$ results in $$\eta_{t,dch}^{ss} = \frac{\text{Average}_{Vch-Vdch}}{2} - \eta_{i,dch} \quad (11)$$

In the range between zero 110 and $t_{ss,dch}$ 122, the voltage correction value is proportional to the square root of t. The value may be scaled so that at time $t_{ss,dch}$ 122, the value will match the steady-state value of $\eta_{t,dch}^{ss}$ 120. The steady state voltage deviation is a function of a difference between the charge voltage data and the discharge voltage data over a predetermined range of state of charge. The difference may be averaged over the state of charge range and used as the steady state voltage deviation. These values when summed according to equation (6) yield a close approximation to the OCV curve in the range up to $t_{j,dch}$ 124.

Next, the voltage for the charge data may be corrected to complete the curve in the region greater than $t_{j,dch}$ 124. This is done in a similar manner as for the discharge data. The OCV during charging may be described as $$\text{OCV} = V_{ch} - \eta_{i,ch} - \eta_{t,ch} \quad (12)$$

The value of $\eta_{i,ch}$ 128 may be obtained by subtracting a stable OCV 132 prior to charge current onset from the voltage at the first data point 130 measured after current onset. This value may be reconciled with the value of $\eta_{i,dch}$ 114 at the joining point 136. The joining point 136 may be described as the point at which the charge and discharge voltage corrections should yield the same value. The point 136 may also be considered to be the time at which the steady-state voltage deviation is entered during charging. That is, the corrected charge voltage at $t_{j,ch}$ 134 should equal the corrected discharge voltage at $t_{j,dch}$ 124. A linear variation is assumed which results in the following equation:

$$\eta_{i,ch} = \eta_{i,ch}^{t=0} - \frac{\eta_{ch}^{t=0} - \eta_{dch}^{t=0}}{t_{j,ch}} t \text{ for } 0 < t < t_{j,ch} \quad (13)$$

where $\eta_{i,ch}^{t=0}$ is the overvoltage at the onset of charge current 130. Note that at the joining point 136, the value $\eta_{i,ch}$ will be equal to $\eta_{dch}^{t=0}$.

Similar to the discharge case, the following equation applies for charging:

$$\eta_{t,ch} = \frac{\eta_{t,dch}^{ss}}{\sqrt{t_{j,ch}}} \sqrt{t} \text{ for } 0 < t < t_{j,ch} \quad (14)$$

where t is the charge time. Note that at the joining point 136, the value of $\eta_{t,ch}$ will be equal to $\eta_{t,dch}^{ss}$. By reconciling the measured charge data, the corrected charge and discharge curves form a continuous curve.

To summarize, a relatively fast charge/discharge rate may be applied to the battery. Voltages and currents may be measured and collected during the charge/discharge sequence. Data may then be processed according to the above equations. A voltage deviation at discharge current onset is determined. A steady-state voltage deviation is also calculated from the charge and discharge voltage data based on an average value of the charge and discharge voltage data. The steady state range may be where the differences between the charge voltage and discharge voltage values at each state of charge are approximately equal over the range. In the range after discharge current onset and before the joining point, the voltage is adjusted according to equation (6). These corrections are applied to the measured discharge voltage data to obtain the actual OCV relationship. An initial charge voltage deviation is determined at the onset of the charge current. The steady-state voltage deviation is assumed to be the same as for the discharge case. In the range after charge current onset and before the joining point, the voltage is adjusted according to equation (12). Within a predetermined state of charge range, the voltage characteristic is a function of a difference between the charge and discharge data. An average of the difference may be used. At the endpoints of the predetermined state of charge range, the characteristic values due to the difference of the charge and discharge values should be equal to the values calculated using the square root of time. At the joining point, the corrected charge voltage and the corrected discharge voltage are reconciled so that the voltages are equal at that point. This provides one continuous curve representing the OCV characteristic. Current may be measured during the charge/discharge cycle in order to update the SOC value.

The battery charge/discharge voltage data may be measured with respect to time. The final result may require that the OCV curve be generated with respect to the battery state of charge. Battery SOC may be determined based on the current and the time. SOC may be expressed in units of Amp-hours (Ah). Knowing the time that the current is applied, one may calculate the associated SOC. For example, consider a 5 Ah battery being charged at a 1−C rate. Assuming the battery is at zero percent SOC, an applied current of 5 A for one hour would fully charge the battery to 5 Ah or 100 percent SOC. From this knowledge, the SOC may be correlated to time. In this example, 50 percent SOC would occur halfway through the cycle or at 30 minutes. This can also be analyzed as a standard Amp-hour integration. Assuming a constant current, the incremental SOC may be determined as the current multiplied by the time interval. Amp-hour integration may also be used to determine the SOC. The current may be integrated over time to obtain an SOC value.

The OCV vs. SOC relationship may be used for controlling the charging and discharging of the battery pack. The relationship may also be used for determining power limits and other parameters for vehicle controls. Knowledge of this relationship also impacts the calculation of SOC during pack operation. An accurate measure of SOC is useful as it may provide the driver with a status of how much energy is in the battery at a given time. Many existing implementations have this relationship programmed into the controller during development or at initial vehicle build. Since existing techniques for generating this relationship are time consuming, the relationship may never be changed over the life of a vehicle. The proposed method, providing a more reasonable time for generating the relationship, may provide options for updating the relationship during service. The method may be programmed into a vehicle controller to allow service personnel to perform a calibration during service operations.

The method disclosed may work on an individual battery cell or a series connection of multiple battery cells. In a battery pack, each cell may be characterized by performing the disclosed method on the pack, assuming that each cell voltage is measured. Each battery cell may be characterized during a service operation and the resulting characteristic curve stored in non-volatile memory for later use. A more practical approach may be to average the characteristics of all the cells for later use or to characterize the battery based on the overall pack voltage. The characterization could be part of a service operation in which the characteristic is calculated and stored to allow optimal operation of the battery over the life of the battery.

Figure 5:
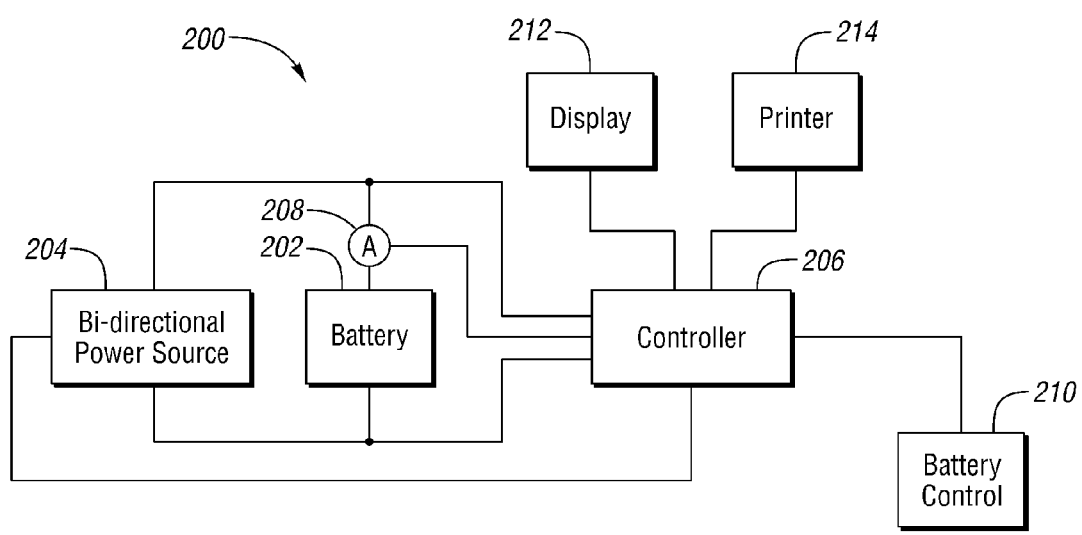
FIG. 5 is a diagram of a test apparatus to obtain the battery voltage characteristic.

In one possible embodiment shown in FIG. 5, a battery characterization apparatus 200 may be devised to ascertain the OCV vs. SOC characteristic curve for a battery 202. The battery 202 may be placed in the battery characterization apparatus 200 and charged and discharged according to the methods described. A bi-directional power source 204 may be connected to the battery 202 to charge and discharge the battery 202. The bi-directional power source 204 has the capability to source and sink current. That is, the bi-directional power source 204 is capable of acting as both a power supply and a load. The bi-directional power source 204 may be a separate power supply and a load that may be controlled to supply or dissipate power.

A controller 206 may be present to measure the voltage across the battery 202 during the characterization process. The controller 206 may also measure the battery current using a current sensor 208. The controller 206 may also be capable of controlling the bi-directional power source 204 during the characterization process. The control may be over discrete lines or via a communications bus.

The battery 202 may be in a known initial state of charge at the start of the test. For example, the battery may be fully charged (100% SOC) prior to starting the characterization process. In this case, the controller 206 may begin measuring the battery voltage and the bi-directional power source 204 may be commanded to draw a predetermined amount of current from the battery. The controller 206 may then measure the voltage across the battery 202 during the discharge. When the controller 206 has determined that the battery 202 has been fully discharged, the bi-directional power source 204 may be switched off to terminate drawing current from the battery 202. A rest period may be entered to allow the voltage to relax to a stable value. The bi-directional power source 204 may then be commanded to provide current to the battery 202 in order to charge the battery 202. The controller 206 may then continuously measure the voltage and current during charging. When the battery 202 is fully charged, the bi-directional power source 204 may be switched off to terminate providing current to the battery 204. The measured data may then be processed by the controller 206 as described above to generate an OCV vs. SOC characteristic for the battery. The controller 206 may communicate the collected data to another computing device to further process the data. This characteristic may be provided to a battery control algorithm 210 to control charging and discharging of a battery 202. The characteristic may be stored in a non-volatile storage medium and may be displayed on a screen 212 or printed on a printer 214. The bi-directional power source 204 may be manually controlled by an operator or controlled by the controller 206. The procedure may be adjusted should the initial state of charge be unknown by charging or discharging the battery 202 as necessary to obtain a known starting state of charge.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A vehicle comprising:
   at least one battery cell; and
   at least one controller programmed to, in response to a state of charge of the at least one battery cell falling within a range of states of charge for which differences between charge and discharge voltage values previously measured during charging and discharging at each of the states of charge are approximately equal, charge and discharge the at least one battery cell based on the differences.

2. The vehicle of claim 1 wherein the at least one controller is further programmed to charge and discharge the at least one battery cell based on at least one of a charge time of the previously measured charge voltage values and a discharge time of the previously measured discharge voltage values in response to the state of charge falling outside of the range of states of charge.

3. The vehicle of claim 1 wherein the at least one controller is further programmed to charge and discharge the at least one battery cell based on a square root of charge time of the previously measured charge voltage values in response to the state of charge falling outside of the range of states of charge.

4. The vehicle of claim 1 wherein the at least one controller is further programmed to charge and discharge the at least one battery cell based on a square root of discharge time of the previously measured discharge voltage values in response to the state of charge falling outside of the range of states of charge.

5. The vehicle of claim 1 wherein the previously measured charge and discharge voltage values result from charging and discharging the at least one battery cell at a generally constant current such that the differences between the measured charge and discharge voltage values exceed a predetermined amount.

6. An apparatus comprising:
a bi-directional power supply electrically connected to at least one battery cell; and at least one controller programmed to generate output representing a relationship between voltage and state of charge for the at least one battery cell based on differences between measured charge and discharge voltage values of the at least one battery cell while a state of charge of the at least one battery cell falls within a range of states of charge for which the differences at each state of charge within the range are approximately equal.

7. The apparatus of claim 6 wherein the at least one controller is further programmed to generate output representing the relationship between voltage and state of charge for the at least one battery cell based on a charge time while charging and a discharge time while discharging when the state of charge falls outside of the range of states of charge.

8. The apparatus of claim 6 wherein the bi-directional power supply is commanded to charge and discharge the at least one battery cell with a generally constant current based on a rated current capacity of the at least one battery cell.

9. The apparatus of claim 6 wherein the at least one controller is further programmed to generate output representing the relationship between voltage and state of charge for the at least one battery cell based on a square root of charge time when charging at a state of charge outside of the range of states of charge.

10. The apparatus of claim 6 wherein the at least one controller is further programmed to generate output representing the relationship between voltage and state of charge for the at least one battery cell based on a square root of discharge time when discharging at a state of charge outside of the range of states of charge.

11. A method comprising:
measuring voltage values across a battery during charging and discharging;
calculating a relationship between voltage and state of charge based on differences between the measured charging and discharging voltage values while a state of charge of the battery falls within a range of states of charge for which the differences at each of the states of charge within the range are approximately equal; and
outputting the relationship.

12. The method of claim 11 further comprising calculating the relationship between voltage and state of charge based on a charge time while charging and a discharge time while discharging when the state of charge falls outside of the range of states of charge.

13. The method of claim 11 further comprising calculating the relationship between voltage and state of charge for the battery based on a square root of charge time when charging at a state of charge outside of the range of states of charge.

14. The method of claim 11 further comprising calculating the relationship between voltage and state of charge for the battery based on a square root of discharge time when discharging at a state of charge outside of the range of states of charge.

15. The method of claim 11 wherein the differences between the voltage values measured during charging and the voltage values measured during discharging are averaged over the range of states of charge.

16. The method of claim 11 wherein the charging and discharging is at a generally constant current such that differences between the measured charge and discharge voltage values exceed a predetermined amount.

* * * * *